AMPLIFYING ARRANGEMENT EMPLOYING TUNNEL DIODE
Filed June 24, 1965
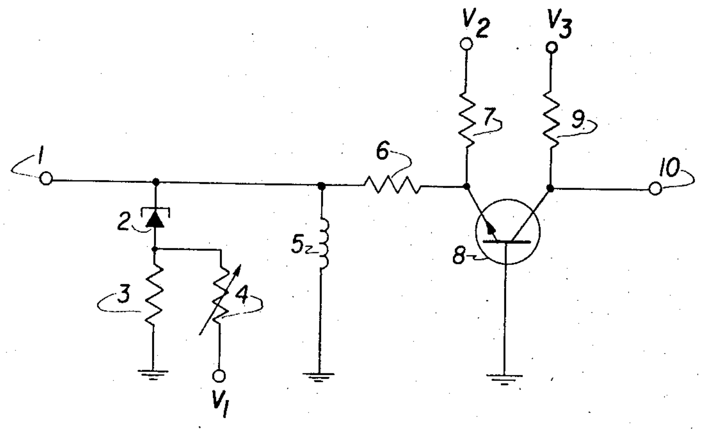
INVENTORS
MAX S. MACRANDER
RICHARD J. BELCASTRO
BY C. A. Gulbrandsen
ATTY.

United States Patent Office 3,366,891
Patented Jan. 30, 1968

3,366,891

AMPLIFYING ARRANGEMENT EMPLOYING TUNNEL DIODE

Max S. Macrander, Wheaton, and Richard J. Belcastro, Chicago, Ill., assignors to Automatic Electric Laboratories, Inc., Northlake, Ill., a corporation of Delaware Filed June 24, 1965, Ser. No. 466,591
2 Claims. (Cl. 330—24)

ABSTRACT OF THE DISCLOSURE

An inductor across the output of a tunnel diode amplifier and a large resistor serially connecting the output to the input of a common base transistor amplifier maintain the bias of the tunnel diode and the gain of the tunnel diode amplifier independent of temperature and power supply variations at the emitter-base input of the common base circuit.

This invention relates to amplfying arrangements, particularly those which employ tunnel diode amplifying circuits.

It is common knowledge that the common base transistor configuration provides low input impedance, high output impedance, low current gain, high voltage gain and moderate power gain. It is also well known that the stability of circuits including tunnel diodes, which are biased in their region of negative resistance, is extremely dependent on voltage stability of adjacent circuits. Any variation of a D.C. condition in a load circuit due to temperature or power supply variations can easily vary the quiescent point of a tunnel diode circuit.

Heretofore, the connecting of a common base transistor circut as the load for a tunnel diode circuit resulted, in, at best, a marginally stable circuit. J. J. Tiemann briefly discusses a common base circuit in his U.S. Patent 3,116,459; however no provision is made therein for the effects of bias variations due to power supply and temperature variations, which may be very pronounced at the base-emitter input circuit of a common base transistor configuration.

It is an object of the invention to provide a new and improved tunnel diode amplifying arrangement.

It is a particular object of the invention to provide a tunnel diode amplifying arrangement which has a bias stability that is substantially independent of temperature and power supply variations.

One feature of the invention resides in the use of an inductance which renders the direct current bias of the tunnel diode independent of voltage variations across the emitter-base junction of the common base transistor circuit which it precedes.

Another feature of the invention resides in the use of a resistance between the tunnel diode and the input circuit of the common base configuration to provide the positive resistance required for current gain and to make said gain independent of temperature variations at the input of the common base configuration.

These and other objects and features of our invention will become apparent and the invention will be best understood from the following description taken in conjunction with the accompanying drawing.

In the drawing a tunnel diode amplifier, generally elements 1–6, has a common base transistor configuration, generally elements 7–10, connected as its load circuit. Direct current source $V_1$, $V_2$, and $V_3$ supply the biasing voltages for the circuits.

More specifically, tunnel diode 2 is connected to input terminal 1 and via inductance 5 to direct current ground.

The other side of the tunnel diode is connected to direct current ground by way of resistance 3 and to supply $V_1$ via variable resistance 4. The quiescent point setting is therefore determined by source $V_1$ and resistances 3 and 4 and not by the transistor characteristics.

The common base transistor configuration has its emitter connected to supply $V_2$ and its collector connected to supply $V_3$ by way of resistances 7 and 9 respectively. Resistance 6 provides the coupling between the tunnel diode circuit and the transistor circuit.

The input impedance of the base-emitter junction of trasistor 8 increases linearly with temperature. Resistance 6 serves two purposes, namely, providing the required positive resistance to match the negative resistance of the tunnel diode for current gain and swamping out variations in the input resistance of the transistor making the gain, to a large degree, independent of temperature variations.

The inductance 5 isolates the tunnel diode from D.C. voltage variations at the emitter-base junction of the transistor. The inductance, by nature of its presence and position, also tends to make the tunnel diode bias independent of temperature and independent of variations in the supply voltages.

In the above-mentioned Tiemann patent, provision was made for preventing oscillation at high frequencies by means of a capacitive shunt circuit at the input of the arrangement. Such a circuit lowers the frequency range by shunting the high frequencies to ground. The present arrangement does not require such circuit provisions. To the contrary, high frequencies encounter a high impedance at inductance 5. The useful frequency range is not a function of the tunnel diode, but is only limited by the alpha cutoff frequency of the transistor.

In summary, the present invention provides a tunnel diode-common base amplifying configuration which possesses a high degree of independence of temperature, a high degree of independence of power supply variations, current gain, and a usable frequency range which extends from direct current up to very high frequencies limited only by the alpha cutoff frequency of the transistor.

Many changes and modifications may be made in the invention by one skilled in the art without departing from the spirit and scope of the invention and should be included in the appended claims.

We claim:

1. A signal amplifying arrangement comprising: an input terminal for receiving signals to be amplified; a source of direct current potentials including a reference potential; a two terminal tunnel diode having a first of said two terminals connected to said input terminal; an inductor connected between said first terminal and said reference potential of said source; a first resistor connected between another of said potentials of said source and the second of said two terminals, said inductor, said first resistor and said source of potentials biasing said tunnel diode at a negative resistance quiescent point; a common base transistor amplifier including an input terminal which has a low input impedance; and a second resistor serially connected between said input terminal of said transistor amplifier and said first terminal of said tunnel diode, the value of said second resistor being equal to the quiescent negative resistance of said tunnel diode and substantially greater than the low input impedance of said transistor amplifier.

2. A signal amplifying arrangement comprising: a source of direct current potentials including a reference potential; first, second, third, fourth and fifth resistance means; a transistor including a base, a collector and an emitter, said base being connected to said reference potential, said emitter being connected to a first of said potentials via said first resistance means and said collector being connected to a second of said potentials via said second resistance means; inductance means; an input terminal for receiving said signals; a two terminal tunnel diode having one of said two terminals connected to said input terminal said one terminal further being connected via said third resistance means to said emitter and via said inductance means to said reference potential, the other of said two terminals being connected via said fourth resistance means to a third of said potentials and via said fifth resistance means to said reference potential.

References Cited

UNITED STATES PATENTS 3,315,093 4/1967 Abraham ----------- 307—88.5

OTHER REFERENCES

Wiley: Telemetry On Muscle Power, Electronics, Sept. 20, 1963, pp. 14–15.

ROY LAKE, *Primary Examiner.*

L. J. DAHL, *Assistant Examiner.*